United States Patent
Colbert et al.

(10) Patent No.: US 7,071,720 B2
(45) Date of Patent: Jul. 4, 2006

(54) METHOD AND APPARATUS FOR MANAGING ALIGNING AND COUPLING OF A LAND GRID ARRAY INTERPOSER FOR A FIELD REPLACEMENT UNIT

(75) Inventors: John Lee Colbert, Byron, MN (US); Roger Duane Hamilton, Rochester, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 10/865,253

(22) Filed: Jun. 10, 2004

(65) Prior Publication Data

US 2005/0275420 A1    Dec. 15, 2005

(51) Int. Cl.
*G01R 31/02* (2006.01)

(52) U.S. Cl. .................................................. 324/763

(58) Field of Classification Search ............... 324/755, 324/760, 763, 765, 158.1; 174/35; 361/809; 439/330, 76.2, 342, 242
See application file for complete search history.

(56) References Cited

U.S. PATENT DOCUMENTS

| 5,648,893 | A | 7/1997 | Loo et al. |
| 5,793,618 | A | 8/1998 | Chan et al. |
| 5,917,703 | A | 6/1999 | Murphy |
| 6,084,178 | A | 7/2000 | Cromwell |
| 6,198,630 | B1 | 3/2001 | Cromwell |
| 6,218,910 | B1* | 4/2001 | Miller ......................... 333/33 |
| 6,282,093 | B1 | 8/2001 | Goodwin |
| 6,449,155 | B1 | 9/2002 | Colbert et al. |
| 6,475,011 | B1 | 11/2002 | Sinha et al. |
| 6,639,416 | B1* | 10/2003 | Akram et al. ............... 324/755 |
| 6,914,445 | B1* | 7/2005 | Fan et al. .................... 324/755 |

* cited by examiner

*Primary Examiner*—Jermele Hollington
*Assistant Examiner*—Tung X. Nguyen
(74) *Attorney, Agent, or Firm*—James R. Nock

(57) ABSTRACT

An apparatus adapted for use in a field replacement unit that is to be coupled to an electronic module. Included in the apparatus are a cover assembly; a biasing assembly disposed within the cover assembly; and, an aligning and coupling mechanism retained in the cover assembly in juxtaposed relation with the biasing assembly for mounting an interposer assembly in a manner, whereby the interposer assembly is generally self-aligned along in-plane axes with respect to the cover assembly for subsequent coupling to an electronic module. A method for use of the apparatus is disclosed.

10 Claims, 5 Drawing Sheets

METHOD AND APPARATUS FOR MANAGING ALIGNING AND COUPLING OF A LAND GRID ARRAY INTERPOSER FOR A FIELD REPLACEMENT UNIT

BACKGROUND OF THE INVENTION

The present invention relates generally to improved electronic field replacement units. More particularly, it relates to method and apparatus for managing the aligning and coupling of interposers for use in field replacement units.

In general, field replacement units are used for facilitating handling of devices in manufacturing, transportation, distribution, as well as for installation in both manufacturing and repair environments. The trend in electronic packaging is to use interposer assemblies for interconnecting integrated circuit packages with boards because they provide high density and high reliability connections. For instance in the computer industry, field replacement units are used for containing land-grid array (LGA's) interposers for use in combination with multi-chip modules (MCM's). LGA's permit direct electrical connection between a module surface and a printed circuit board through a conductive interposer. Connection is achieved by aligning the contact areas of the two mating surfaces and compressing the interposer in between. Various interposer technologies exist. Some include compressible contacts from conductive springs to conductive elastomers. The interposer contacts interface directly with contact lands on the modules and the circuit boards in a removable and re-installable format. One widely used contact technology is the fuzz button type which consists of a plurality of individual coiled wires, each of which resides in a corresponding passage of the interposer body, whereby each extends above and below such passages.

It is important that damage to these interposer contacts should be greatly minimized or eliminated since occurrence of such damage may lead to inabilities to establish the desired electrical connections for effective operation, and overall load balancing problems for the interposer. Therefore, care must be exercised in insuring that the individual interposer contacts do not become damaged and/or displaced because of misalignment from their intended positions. Previous efforts at preventing undue movement of the individual contacts or misalignment of the interposers led to preloading them against a surface to prevent interposer movement. However, such preloading may have a tendency, on rare occasions, to permanently deflect or displace a significant number of contacts from their desired positions. Also, proper alignment was not afforded, thereby resulting in load balancing problems. As a result, a number of problems such as failure to establish the desired electrical connections and improper load balancing may be introduced with known approaches.

Accordingly, there are needs for methods and apparatus for managing aligning and coupling of first and second circuit devices through interposers; particularly, in field replacement units for use in electronic modules so as to enhance load balancing and minimize damage to interposer contacts.

Without methods and apparatus meeting such needs, the true potential of effectively managing the aligning and coupling of interposers relative to first and second circuit devices, particularly in combination with field replacement units, may be less than entirely satisfactory.

SUMMARY OF THE INVENTION

The present invention provides enhanced methods and apparatus for managing land grid array alignment and coupling for a field replacement unit or the like. Included is an aligning and coupling mechanism that is adapted to mount a land grid array interposer assembly in a manner which enhances even load balancing of the interposer assembly, and reduces damage to interposer contacts.

In accordance with the present invention, provision may be made for an assembly that is adapted for use in a field replacement unit. The assembly comprises a first cover assembly; a biasing assembly; and, an aligning and coupling mechanism mounted on the cover assembly for mounting an interposer assembly. The aligning and coupling mechanism is coupled to the cover assembly, whereby the interposer assembly is generally self-aligned along in-plane axes with respect to the first cover assembly for subsequent coupling with an electronic module. The aligning and coupling mechanism also locates the interposer assembly in a preferred location along a Z-axis relative to surfaces of a field replacement unit for enhancing protection of interposer contacts from premature contact with such surfaces that may damage them. The field replacement unit may be of the kind used for an electronic assembly, such as a multi-chip module used in a computer system.

In preferred illustrated embodiments, the aligning and coupling mechanism is mounted to the cover assembly in a manner so as to provide self-aligning of the interposer assembly in an X-Y plane so as to enhance load balancing and to position the interposer assembly at a predefined position along a Z-axis relative to the first cover assembly, whereby interposer contacts of the interposer assembly may be spaced from surfaces of a second cover assembly that forms a field replacement unit.

An aspect of this invention is that it satisfactorily addresses problems of maintaining generally even load balancing of an interposer assembly, preferably of the land grid array type, so as to facilitate electrical connections between a pair of spaced apart first and second circuit devices.

Another aspect of this invention is that it satisfactorily addresses problems of minimizing damage to interposer contacts of land grid array interposers particularly used in field replacement unit, thereby enhancing the desired electrical connections.

A still further aspect of the present invention is an aligning and coupling mechanism which mounts and self-aligns interposer assemblies mounted thereon.

A still further aspect of the present invention is an aligning and coupling mechanism which protectively spaces the interposer contacts from a second cover assembly of the field replacement unit.

The aspects described herein are merely a few of several that can be achieved by using the present invention. The foregoing descriptions do not suggest, however, that the invention must be used only in a manner to attain the foregoing aspects.

These and other features and aspects of the present invention will be more fully understood from the following detailed description of the preferred embodiments, which should be read in light of the accompanying drawings. It should also be understood that both the foregoing generalized description and the following detailed description are exemplary, and are not restrictive of the invention.

DETAILED DESCRIPTION

Figure 1:
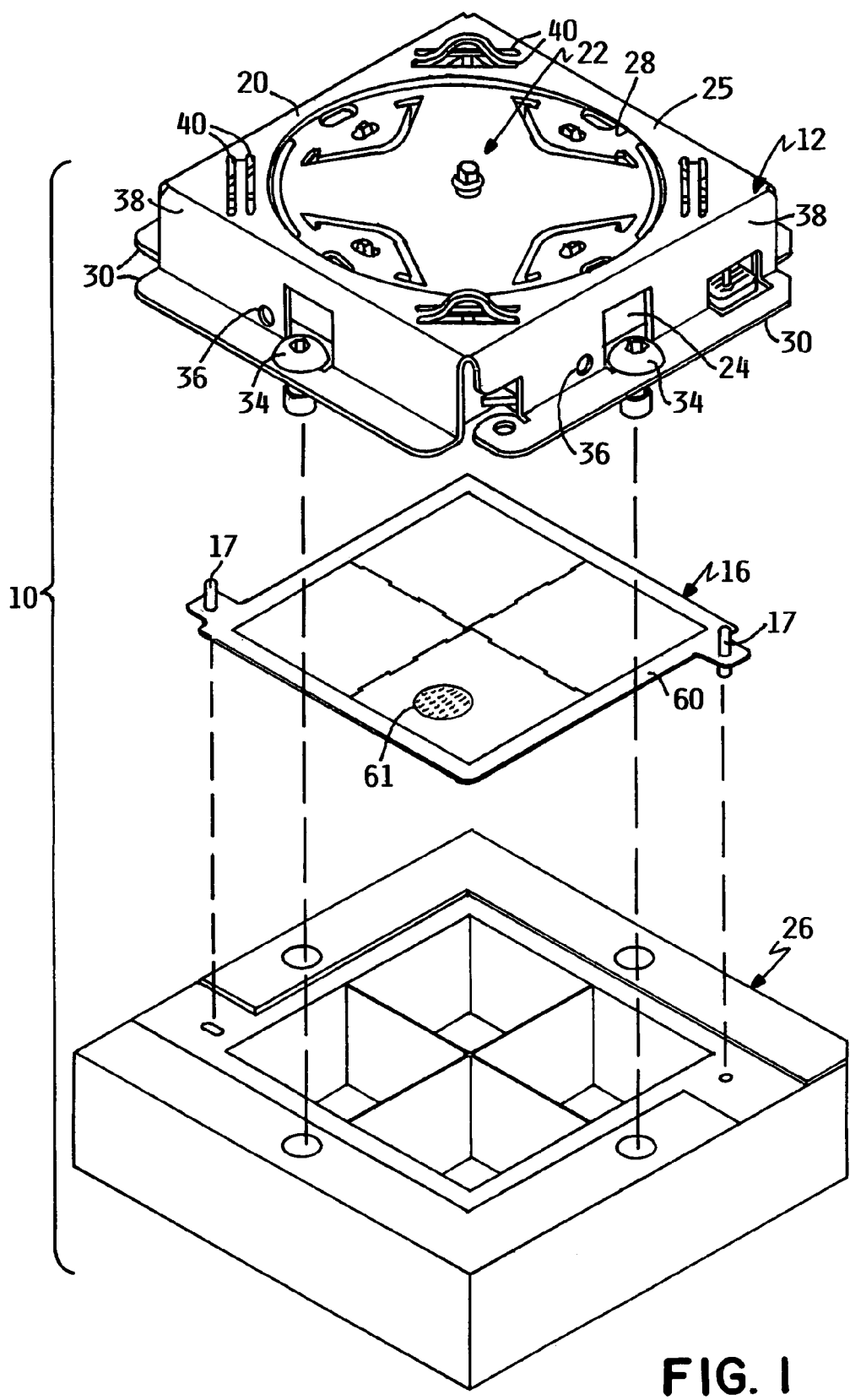
FIG. 1 is an exploded perspective view of a field replacement unit forming an aspect of the present invention.
Figure 2:
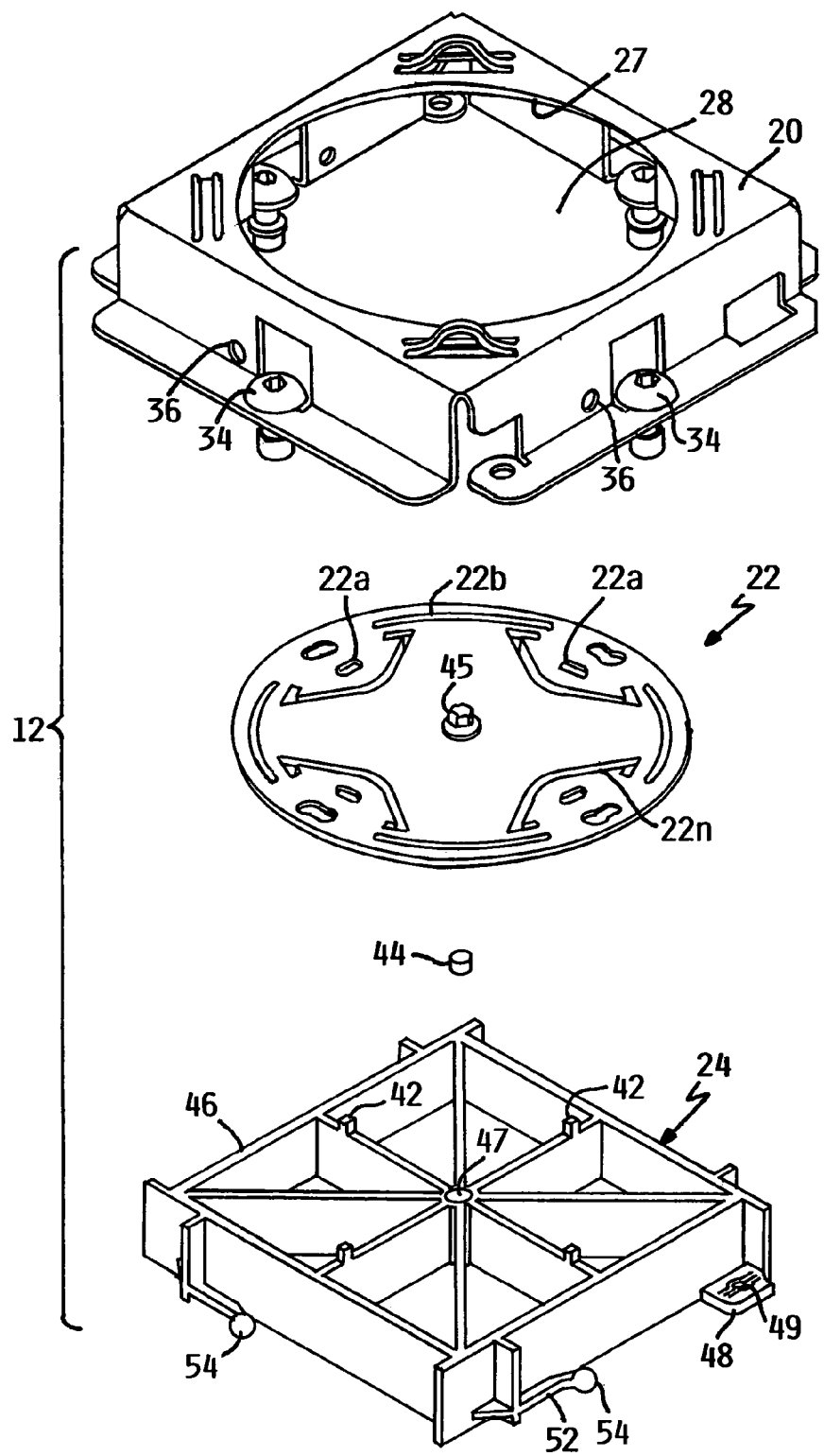
FIG. 2 is an exploded perspective view of an assembly for use in forming a field replacement unit.
Figure 3:
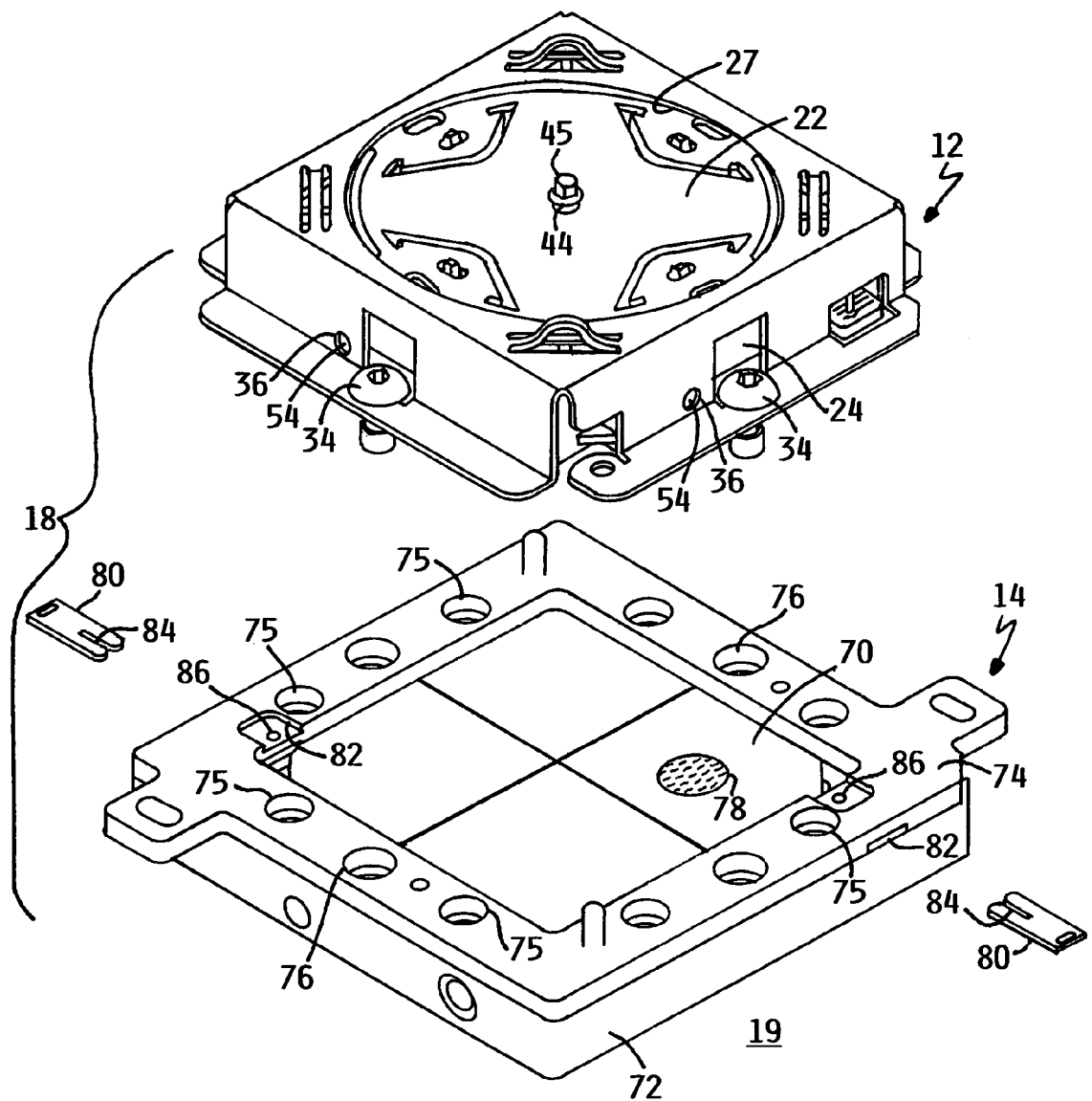
FIG. 3 is an exploded perspective view of a portion of the assembly illustrated in FIG. 2 being electrically coupled to a multi-chip module assembly.

FIG. 1 illustrates several components forming one preferred embodiment of a field replacement unit or assembly 10 for use with electronic modules or the like. FIG. 2 illustrates an aligning and coupling apparatus or assembly 12 that forms a portion of the field replacement unit depicted in FIG. 1 and is adapted to be electrically coupled to a multi-chip module assembly 14 (FIG. 3) through a land grid array (LGA) interposer assembly or connector 16 (FIG. 1). The latter assemblage of components includes the multi-chip module assembly 14 and may also form a field replacement unit 18. The multi-chip module assembly 14 when assembled thereto also forms part of a computer system generally designated by reference numeral 19 (FIG. 3). It will be appreciated that the field replacement assemblies facilitate handling in manufacturing, transportation, as well as installation in both manufacturing and repair environments. Besides the present invention being utilized in computer systems, other electronic assemblies are envisioned to be embraced by its concepts.

Continued reference may be made to FIGS. 1 and 2 for illustrating the aligning and coupling assembly 12. Included in the aligning and coupling assembly 12 is a first or protective shipping cover assembly 20, a flat spring plate assembly 22, and an interposer aligning and coupling mechanism 24 that is adapted to retain releasably the interposer connector 16. The interposer connector 16 is contained by and between the interposer aligning and coupling mechanism 24 and a second or shipping cover element or assembly 26 so as to form the field replacement unit 10.

The protective shipping cover assembly 20 may have a generally square-shaped body 25 defining a recess 27 for removably receiving the interposer aligning and coupling mechanism 24 in a nested relationship. The protective shipping cover assembly 20 has a central circular opening 28 that provides access to the spring plate assembly 22 for known loading purposes. Also, there is also provided a plurality of mounting flanges 30. The mounting flanges 30 laterally extend from each aide of the body 25 and are adapted to be secured to an exterior protective shipping cover assembly 26 (FIG. 1), by a plurality of fastening mounting members, such as bolts 34 that are located intermediate each of the flanges. Each of a plurality of alignment openings 36 is formed in a respective one of the upstanding walls 38 of the body 25. The alignment openings 36 act in a manner to be described with the interposer aligning and coupling mechanism 24. As will be described, both the protective cover assembly 20 and the interposer aligning and coupling mechanism 24 function for aligning the interposer connector 16 along in-plane axes (X-Y plane), see FIG. 1 and for positioning it in the Z-axis relative to the X-Y plane. A plurality of generally arcuate shaped and raised standoffs 40 are integrally formed on the protective shipping cover assembly 20 and are mounted adjacent each of the corners thereof. The standoffs 40 facilitate handling of the field replacement electronic unit or assembly 10 by allowing the aligning and coupling assembly 12 to be placed on a surface, and yet maintain the spring plate assembly 22 out of contact with such surface. The protective shipping cover assembly 20 is, preferably, made of a suitable material so as to dissipate electrical charges.

The flat spring plate assembly 22 is contained within the protective shipping cover assembly 20. The spring plate assembly 22 is of a known kind used for relatively large scale multi-chip modules. The spring plate assembly 22 provides a sufficient compressive force for loading the interposer connector 16 into an intimate and firm engagement with the multi-chip module, thereby ensuring a firmly coupled engagement. The spring plate assembly 22 provides for a linear force deflection curve resulting in more uniform and tighter load control in the assembly. In this embodiment, the spring plate assembly 22 is circular and has several arcuate and other openings and cutouts 22 $a$–$n$. Small cutouts 22$a$ on the spring plate assembly 22 engage small upstanding nubs 42 on the interposer aligning and coupling mechanism 24 for alignment purposes. A threaded bushing 44 is press fit in the center of the spring plate assembly 22 and has threadedly installed therein a suitable loading screw 45 (FIG. 3). As is known, the loading screw 45 is rotated and will deflect the spring plate assembly for effecting loading. Once the loading screw 45 acts through the spring plate assembly 22, the latter compressively loads the bottom of the interposer connector 16 against interconnects of the multi-chip module assembly 14.

Figure 4:
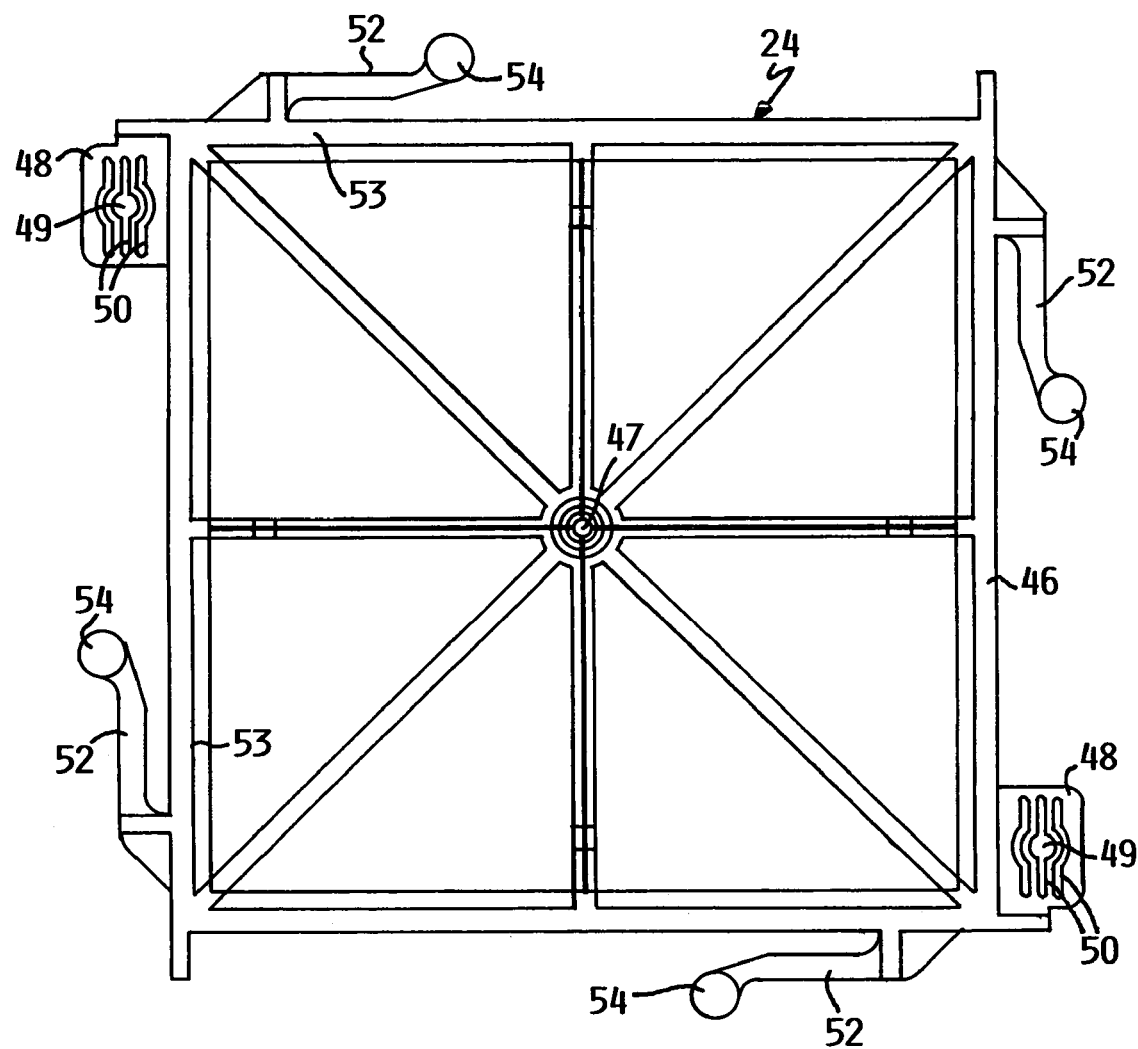
FIG. 4 is a top view of one preferred embodiment of the aligning and coupling mechanism of the present invention.

Reference is now made to FIGS. 2 and 4 for illustrating an interposer aligning and coupling mechanism 24 of the aligning and coupling assembly 12. The interposer aligning and coupling mechanism 24 includes, for example, a unitary, square, and box-shaped body 46. The box-shaped body 46 is sized and shaped to be located and retained in and by the shipping cover assembly 20. The box-shaped body 46 has a cored and relatively rigid construction that may be made of plastic or other suitable materials to provide for a lightweight and yet rugged construction to withstand the compressive forces contemplated for use. The body 46 also has a threaded opening 47 (FIGS. 2 & 4) into which the threaded loading member 45 is received. As noted, the loading member 45 also engages the bushing 44 in a known manner so that when actuated the spring plate assembly 22 may be loaded appropriately during installation. At diametrically opposed corners, for example, there is provided a pair of laterally extending tabs 48 (FIGS. 2 & 4), each being provided with an opening 49 defined by releasable coupling rib members 50. The openings 49 releaseably cooperate with the pins 17 of interposer connector 16 so as to releasably hold the latter.

Figure 5:
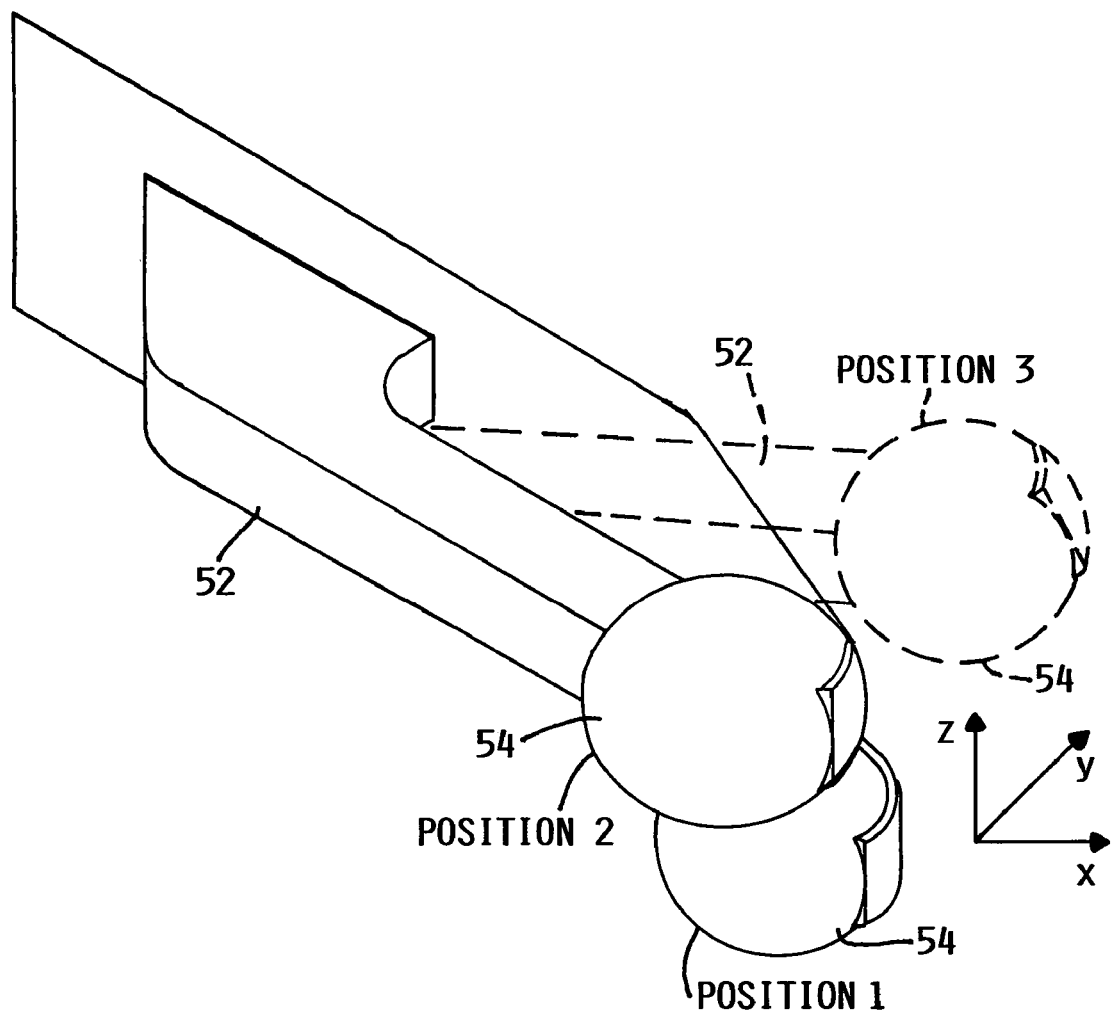
FIG. 5 illustrates in solid lines the original (position 1) undeflected arrangement of one of the spring fingers forming an aspect of the present invention, and in a vertically displaced Z-axis position (position 2); and in phantom lines (position 3) illustrates the spring finger in a deflected position in an X and Y plane that aligns the aligning and coupling mechanism.

Reference may be made to FIGS. 2 and 4–5 for illustrating a plurality of aligning and biasing elements or fingers 52 that serve to provide aligning and biasing features to the interposer connector 16 relative to the protective shipping cover assembly 20. Each of the fingers 52 is the same as the others so a description of only one is set forth. A proximal end of the finger 52 extends from a wall so as to be in spaced and generally parallel relationship therewith. The fingers 52 may be elongated and terminate at their distal ends with enlarged rounded projections 54. Each rounded projection 54 is adapted to be resiliently and releaseably retained in the opening 36 in the wall 38 when the body 46 is installed within the cover assembly 20. The fingers 52 are resiliently deflectable both along in-plane X and Y axes defined by the plane of an interposer mounting surface of the body 46 as well as along the Z-axis, as is shown in FIG. 5. The Z-axis is along a vertical axis, as viewed in the drawings, of the body 46.

When the body 46 is assembled within the protective cover assembly 20, the projections 54 of the fingers 52 engage the openings 36 of the protective cover assembly. As a result, the fingers 52 will be deflected inwardly and upwardly from the original or normal unloaded solid line position (1) so as to be resiliently retained within the openings 36. In particular, the fingers 52 are deflected vertically to the deflected position (2). Moreover, the fingers 52 are deflected laterally to position (3) with respect to the original position (1). As a consequence, the fingers 52 are compressed inwardly toward the body 46 and serve to self-align the body 46 with respect to the protective cover assembly along the in-plane axes (X-Y). As a result, an interposer connector 16 mounted on the body 46 may be generally correctly aligned for subsequent joining to the multi-chip module assembly. As noted, the fingers 52 are deflected generally vertically (see position 2) along the Z-axis relative to the in-plane axes, as well when installed. Accordingly, the fingers 52 collectively retain the body 46 generally inwardly with respect to the interior of the cover assembly 20. This will tend to space the interposer connector 16 from the protective cover assembly 26 when the two are joined together. This is beneficial when dealing with certain kinds of interposers, wherein it is desirable to keep the electrical connectors thereof out of contact with any surface which it might engage until such time that the electrical contacts or connectors will be biased into firm electrical engagement with the electrical connectors of the multi-chip module assembly. As noted, if the electrical contacts of the interposer connector become displaced, such as by being tilted or otherwise moved from their intended positions or otherwise damaged from premature contact, then when actual coupling is to be effected, there may be less likelihood that the desired electrical connections will become effective. Such displacements and undesired contact of the electrical connectors might otherwise occur when the interposer is subject to vibration during shipping, handling or installation. As a consequence, the interposer contacts are internally spaced when in the assembled field unit 10 so as to avoid unnecessary contact that might damage them. When the threaded loading member 45 is rotated then sufficient force will act on the interposer assembly to overcome the retention forces of the projections 54 in the openings 36 and will downwardly displace and force the interposer assembly into engagement with the multi-chip module.

In the present embodiment, the land grid array (LGA) interposer assembly or connector 16 is a fuzz button type. The fuzz button type comprises a plurality of individual coiled wires (not shown), each of which resides in a corresponding passage (not shown) of plastic interposer body 60, whereby each coiled wire bundle extends above and below such passages. The interposer contacts generally represented by reference numeral 61 interfaces directly with contact lands on the modules and the circuit boards in a removable and re-installable format. It will be understood that the present invention contemplates use with various LGA interposer technologies including those that include compressible contacts or conductive springs or conductive elastomers. However, the present invention is not so limited and envisions use of a wide variety of interposer connectors including those known and those yet to be developed.

In the present invention, the LGA interposer connector 16 is generally self-aligned along in-plane (X-Y) axes with respect to the cover assembly, as noted above, and thus is ready to be more readily joined to the multi-chip module assembly 14; see FIG. 3. The multi-chip module assembly 14 may be of any suitable type. However, the present invention is not so limited and envisions use of a wide variety of multi-chip modules including those known and those yet to be developed as well as other electronic modules. The multi-chip module assembly 14 may comprise a ceramic LGA multi-chip module substrate 70 attached to an overhanging cap 72, preferably with a suitable adhesive layer (not shown). Clearly, other types of attachment mechanisms may be used. The overhanging cap 72 may be made from a thermally conductive material, such as copper. A one-piece mounting bracket 74 is mounted to the overhanging cap 72 as by threaded members (not shown) into openings 75. The mounting bracket 74 is constructed to be in generally surrounding relationship with the multi-chip module substrate 70 that includes module interconnects 78 (some of which are illustrated in FIG. 3) that cover and protrude from the substrate. The interconnects are brought into intimate engagement with the interposer. Provision is made for use of known interposer retainer clips 80. To further assist in properly mounting the interposer connector 16, the retainer clips 80 are generally elongated and sized for sliding movement into slotted openings 82 formed in edges of the mounting bracket 74. The retainer clips 80 have elongated recesses 84 that engage with the alignment pins 17 (not shown) of the interposer connector 16 for securing the latter. The alignment pins 17 are slidably received within alignment pin openings 86.

Once the second protective cover assembly 26 is detached from coupled engagement, through removal of the threaded members 34 with the first protective cover assembly 20, the threaded members 34 are secured to the mounting openings 76 in the mounting bracket 74. In this embodiment, the aligning and coupling mechanism 12 is loaded so that the interposer assembly 16 is mounted on to the multi-chip module substrate 70 by having the loading bolt that is to be threaded through the bushing 44 and rotated. Thereafter, the interposer assembly and the multi-chip module are joined together and may serve as another field replacement unit for subsequent joining to a printed circuit board (not shown) or the like.

The embodiments and examples set forth herein were presented to explain best the present invention and its practical applications, thereby enabling those skilled in the art to make and use the invention. However, those skilled in the art will recognize that the foregoing description and examples have been presented for the purposes of illustration and example only. The description set forth is not intended to be exhaustive or to limit the invention to the precise forms disclosed. In describing the above-preferred embodiments illustrated in the drawings, specific terminology has been used for the sake of clarity. However, the invention is not intended to be limited to the specific terms selected. It is to be understood that each specific term includes all technical equivalents that operate in a similar manner to accomplish a similar purpose. Many modifications and variations are possible in light of the above teachings without departing from the spirit and scope of the appended claims.

What is claimed is:

1. An apparatus adapted for use in a field replacement unit to be coupled to an electronic module; the apparatus comprising: a first cover assembly; a biasing assembly disposed within the cover assembly; and, an aligning and coupling mechanism retained in the cover assembly in juxtaposed relation with the biasing assembly for mounting an interposer assembly in a manner, the aligning and coupling mechanism including a plurality of resiliently deformable spring fingers connected to respective spaced apart wall portions thereof and having distal end portions thereof engaging respective portions of the first cover assembly so as to resiliently retain and center the aligning and coupling mechanism in the in-plane axes with respect to the first cover assembly, whereby an interposer assembly is mounted on the aligning and coupling mechanism and is generally self-aligned along in-plane axes with respect to the cover assembly for subsequent coupling to an electronic module, and wherein the aligning and coupling mechanism locates the interposer assembly in a preferred location along a Z-axis for enhancing protection of interposer contacts of the interposer assembly from premature contact with surfaces of and in the field replacement unit.

2. The apparatus as set forth in claim 1, wherein the plurality of resiliently deformable spring fingers also resiliently bias the aligning and coupling mechanism along a Z-axis with respect to the in-plane axes and the first cover assembly.

3. The apparatus as set forth in claim 2, wherein the plurality of resiliently deformable spring fingers are forced from engagement with the first cover assembly when the spring plate assembly is actuated so as to apply sufficient compressive forces for loading the interposer assembly against the multi-chip module assembly.

4. The apparatus as set forth in claim 1, further comprising: a multi-chip module assembly which is electrically coupled to the interposer assembly.

5. A method of managing aligning and coupling of an interposer assembly for a field replacement unit, the method comprising: providing a first cover assembly; providing a biasing assembly disposed within the cover assembly; and, coupling an aligning and coupling mechanism for carrying an interposer assembly to the first cover assembly, whereby an interposer assembly is generally self-aligned along in-plane axes with respect to the first cover assembly for subsequent coupling to an electronic module, wherein the aligning is by providing a plurality of resiliently deformable spring fingers connected to respective spaced apart wall portions of the aligning and coupling mechanism and having distal end portions thereof engaging respective portions of the first cover assembly so as to resiliently retain and center the aligning and coupling mechanism along the in-plane axes.

6. The method as recited in claim 5 further comprising: using the plurality of resiliently deformable spring fingers for also resiliently biasing the aligning and coupling mechanism along a Z-axis with respect to the in-plane axes and the first cover assembly.

7. A field replacement unit is adapted to be coupled to an electronic module, the field replacement unit comprising: a first cover assembly; a biasing assembly disposed within the cover assembly; an interposer assembly; and, an aligning and coupling mechanism retained in the first cover assembly in juxtaposed relation with the biasing assembly, the aligning and coupling mechanism mounting the interposer assembly in a manner, whereby the interposer assembly is generally self-aligned along in-plane axes with respect to the first cover assembly for subsequent coupling to an electronic module; and, a second cover assembly coupled to the first cover assembly so as to contain the aligning and coupling mechanism and the interposer assembly in the field replacement unit, wherein the aligning and coupling mechanism includes a plurality of resiliently deformable spring fingers connected to respective wall portions thereof and having distal end portions releaseably engaging respective portions of the first cover assembly so as to releaseably retain and center the aligning and coupling mechanism in the in-plane axes with respect to the first cover assembly.

8. The field replacement unit as set forth in claim 7, wherein the plurality of resiliently deformable spring fingers also resiliently bias the aligning and coupling mechanism along a Z-axis with respect to the in-plane axes.

9. The field replacement unit as set forth in claim 7, wherein the aligning and coupling mechanism includes locating projections that cooperate with the biasing element so as to generally align the biasing element with respect to the aligning and coupling mechanism.

10. The field replacement unit as set forth in claim 7 further comprising: a multi-chip module assembly, wherein interposer contacts of the interposer assembly are adapted to be electrically coupled to a multi-chip module assembly of the electronic module assembly when the second cover assembly has been removed from the field replacement unit.

* * * * *